US008487406B2

(12) United States Patent
Darabi et al.

(10) Patent No.: US 8,487,406 B2
(45) Date of Patent: *Jul. 16, 2013

(54) ON-CHIP CAPACITOR STRUCTURE

(75) Inventors: Hooman Darabi, Irvine, CA (US);
Qiang Li, Irvine, CA (US); Bo Zhang,
Las Flora, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/236,536

(22) Filed: Sep. 19, 2011

(65) Prior Publication Data
US 2012/0007215 A1    Jan. 12, 2012

Related U.S. Application Data

(63) Continuation of application No. 11/411,648, filed on Apr. 26, 2006, now Pat. No. 8,049,302, which is a continuation-in-part of application No. 11/241,142, filed on Sep. 30, 2005, now Pat. No. 7,675,138.

(51) Int. Cl.
*H01L 21/02* (2006.01)

(52) U.S. Cl.
USPC ........... 257/532; 257/306; 257/307; 257/312; 257/528; 257/534; 257/E27.046; 257/E27.048; 438/393; 438/396

(58) Field of Classification Search
USPC .................. 257/532, E27.048, 306, 307, 312, 257/528, 534, E27.046; 438/393, 396
See application file for complete search history.

(56) References Cited

U.S. PATENT DOCUMENTS

| 4,211,941 | A | * | 7/1980 | Schade, Jr. ................ 327/565 |
| 5,208,725 | A |   | 5/1993 | Akcasu |
| 5,670,881 | A |   | 9/1997 | Arakawa et al. |
| 5,815,051 | A | * | 9/1998 | Hamasaki et al. ............ 333/172 |
| 6,020,841 | A |   | 2/2000 | Susak |
| 6,208,500 | B1 | * | 3/2001 | Alexander et al. ............ 361/303 |
| 6,285,865 | B1 |   | 9/2001 | Vorenkamp et al. |

(Continued)

OTHER PUBLICATIONS

Non-Final Office Action Recieved for U.S. Appl. No. 11/241,142 mailed on Aug. 27, 2007, 11 Pages.

(Continued)

*Primary Examiner* — Kenneth Parker
*Assistant Examiner* — John Lin
(74) *Attorney, Agent, or Firm* — McDermott Will & Emery LLP

(57) ABSTRACT

At least a first capacitor is formed on a substrate and connected to a first differential node of a differential circuit, and the first capacitor may be variable in capacitance. A second capacitor is formed on the substrate and connected to a second differential node of the differential circuit, and the second capacitor also may be variable. A third capacitor is connected between the first differential node and the second differential node, and is formed at least partially above the first capacitor. In this way, a size of the first capacitor and/or the second capacitor may be reduced on the substrate, and capacitances of the first and/or second capacitor(s) may be adjusted in response to a variable characteristic of one or more circuit components of the differential circuit.

23 Claims, 10 Drawing Sheets

U.S. PATENT DOCUMENTS

| | | | |
|---|---|---|---|
| 6,391,707 | B1 | 5/2002 | Dirnecker et al. |
| 6,465,868 | B1 | 10/2002 | Ehben et al. |
| 6,559,499 | B1 | 5/2003 | Alers et al. |
| 6,653,681 | B2 * | 11/2003 | Appel ............... 257/307 |
| 6,721,380 | B2 | 4/2004 | Hairapetian et al. |
| 6,740,922 | B2 | 5/2004 | Jones et al. |
| 6,792,062 | B2 | 9/2004 | Vaucher |
| 6,927,125 | B2 | 8/2005 | Jones et al. |
| 6,941,116 | B2 | 9/2005 | Jensen et al. |
| 7,102,454 | B2 | 9/2006 | Sze et al. |
| 7,675,138 | B2 | 3/2010 | Zhang |
| 2004/0174655 | A1 | 9/2004 | Tsai et al. |
| 2007/0075350 | A1 | 4/2007 | Darabi et al. |
| 2007/0075397 | A1 | 4/2007 | Zhang |

OTHER PUBLICATIONS

Restriction and Election Requirement Action Received for U.S. Appl. No. 11/241,142 mailed on May 11, 2007, 5 Pages.

Final Office Action Received for U.S. Appl. No. 11/241,142 mailed on Apr. 1, 2009, 13 Pages.

Notice of Allowance received for U.S. Appl. No. 11/241,142, mailed on Dec. 2, 2009, 7 Pages.

U.S. Appl. No. 11/411,648 Non-Final Office Action mailed Dec. 27, 2010, 25 Pages.

U.S. Appl. No. 11/411,648 Notice of Allowance mailed Jul. 12, 2011, 14 Pages.

* cited by examiner

US 8,487,406 B2

ON-CHIP CAPACITOR STRUCTURE

CROSS-REFERENCE TO RELATED APPLICATIONS

This application is a continuation of application Ser. No. 11/411,648 filed on Apr. 26, 2006, and title "ON-CHIP CAPACITOR STRUCTURE WITH ADJUSTABLE CAPACITANCE", which is continuation-in-part of, and claims priority under 35 U.S.C. 120 to, application Ser. No. 11/241,142, filed Sep. 30, 2005, and titled ON-CHIP CAPACITOR STRUCTURE, the contents of which are hereby incorporated by reference herein in their entirety.

TECHNICAL FIELD

This description relates to capacitor structures.

BACKGROUND

Capacitors may be used with or in many different types of integrated circuits or microchips ("chips"). For example, metal-oxide-semiconductor ("MOS") capacitors may be formed on a substrate, and may be used in circuits including, for example, filters, phase-locked loops, memory circuits, voltage control oscillators, switching circuits, or amplifiers. Additionally, such capacitors may be formed off of a chip containing the rest of the circuit(s), and then connected to the chip for operation of the circuit(s) as a whole.

A given example of such circuits may be implemented as either a single-ended circuit or as a differential circuit. For example, a differential circuit may be implemented as two single-ended circuits, where the two single-ended circuits are provided with different power supply and/or ground references with respect to one another. Then, for example, by designing and/or operating the references and/or the differential circuit such that signals input to each of the included single-ended circuits are equal and opposite of one another, various benefits may be obtained. For example, common-mode noise that is input to both of the two single-ended circuits may be rejected, and even-order distortions in the circuit(s) may be canceled at the differential output.

An example of a circuit that may be single-ended or differential includes a differential filter. In many differential filters, inputs to single-ended and/or differential circuits thereof, may have a varying range of operating characteristics, such as, for example, varying frequencies, voltages, temperatures, or other characteristics. For example, circuit components involved in producing the inputs may produce outputs that vary in one or more of the above-described characteristics (or in other characteristic(s)). In one specific example, a transistor connected to an input(s) of a differential filter may have a frequency that varies over time.

SUMMARY

According to one general aspect, an apparatus includes a first capacitor is formed on a substrate and connected to a first differential node, the first capacitor being variable. A second capacitor is formed on the substrate and connected to a second differential node, and a third capacitor connected between the first differential node and the second differential node and formed at least partially above the first capacitor.

According to another general aspect, a semiconductor device includes a first capacitor formed on a substrate and connected to a first differential node, a second capacitor formed on the substrate and connected to the first differential node in parallel with the first capacitor and connected to a first switch, a third capacitor formed on the substrate and connected to a second differential node, and a fourth capacitor connected between the first differential node and the second differential node and formed at least partially above the first and second capacitors.

According to another general aspect, an apparatus includes a capacitor structure connected to a circuit component and to a differential node of a differential circuit, the capacitor structure associated with at least one switch. The apparatus also includes a control element configured to cause a variation in an effective capacitance of the capacitor structure by opening and closing said switch in response to a variable characteristic of the circuit component.

The details of one or more implementations are set forth in the accompanying drawings and the description below. Other features will be apparent from the description and drawings, and from the claims.

DETAILED DESCRIPTION

Figure 1A:
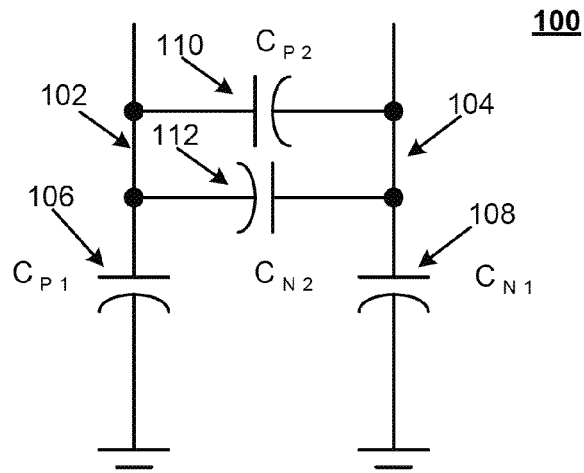
FIG. 1A is a circuit diagram of an equivalent circuit for an on-chip capacitor structure.

FIG. 1A is a circuit diagram of an equivalent circuit 100 for an on-chip capacitor structure. That is, the circuit 100 represents, for example, a number of capacitors that may be formed in an integrated circuit (e.g., on a single chip substrate), as part of a larger differential circuit. By virtue of the various structures that are described herein for implementing the equivalent circuit 100, an amount of space on the chip/substrate may be conserved, while still achieving a desired capacitance for the purposes of the differential circuit.

In FIG. 1A, a node 102 and a node 104 represent differential nodes of a larger differential circuit. Although such a differential circuit is not illustrated in FIG. 1A for the sake of clarity, various examples are discussed and/or illustrated herein (e.g., with respect to FIGS. 3 and 4). Generally, though, and as referenced above, differential circuits may include circuits in which different voltages and/or currents are applied with respect to the nodes 102 and 104, for the purpose of, for example, canceling noise that is present at each of the nodes 102 and 104. For example, as discussed below with respect to FIG. 3, a differential phase-locked loop may be implemented in which the node 102 and the node 104 represent differential inputs to a filter of the differential phase-locked loop.

The equivalent circuit 100 also includes capacitors 106 and 108. The capacitors 106 and 108 are, as illustrated, connected between the differential nodes 102 and 104, respectively, and ground (although it should be understood that the capacitors 106 and/or 108 also may be connected to a power supply voltage, depending on a desired configuration and/or circuit type of the larger differential circuit). The capacitors 106 and 108 may generally be used, for example, in conjunction with other circuit elements in order to provide various types of filtering or smoothing operations with respect to input voltage(s) of a differential circuit. For example, the capacitors 106 and 108 may be used in conjunction with resistors (not shown in FIG. 1) to provide an RC low-pass filter in the context of a phase-locked loop.

The capacitors 106 and 108 may be implemented as metal-oxide-semiconductor (MOS) capacitors formed on a substrate of an integrated circuit chip, or as complementary metal-oxide-semiconductor (CMOS) capacitors. Such capacitors generally have a high capacitance density (i.e., a large amount of capacitance per unit area), and may generally be formed in a straight-forward manner as part of a larger MOS or CMOS processing of the chip as a whole. Such capacitors generally require a connection to ground or to a supply voltage, and consume a relatively large amount of surface area of the substrate on which they are formed, and on which some or all of the rest of the larger differential circuit may be formed. Examples of such capacitors, and their structure and formation, are provided in more detail, below.

Finally in FIG. 1A, capacitors 110 and 112 are connected between the nodes 102 and 104, respectively. In FIG. 1A and in the following examples, the capacitors 110 and 112 may be formed as metal-insulator-metal (MIM) capacitors. Additionally, or alternatively, the capacitors 110 and 112 may be formed as metal finger capacitors or metal comb capacitors, in which the finger and/or comb structures include symmetrical, opposed digits that face one another and are interdigitated (e.g., inserted between one another to form alternating layers of metal and insulating material, in a horizontal and/or vertical direction(s)).

As shown in FIG. 1A, the capacitors 110 and 112 may be formed as floating-point capacitors that are connected between the differential nodes 102 and 104 and do not require a connection either to a supply voltage or to ground. As described and illustrated in more detail herein, the capacitors 110 and 112 may take advantage of a differential nature of the larger differential circuit to obtain the illustrated configuration(s) of FIG. 1A, using a convenient, easily-formed, and reliable connection to the underlying capacitors 106 and 108 (e.g., CMOS capacitors).

The capacitors 110 and 112, in the context of the larger differential circuit, cause equivalent capacitances seen between the differential node 102 and ground, and between the differential node 104 and ground, to be greater than would occur if the capacitors 110 and 112 were not included. As a result, for example, the capacitors 106 and 108 may require a smaller capacitance than would otherwise be required for a given circuit, since the equivalent circuit 100 as a whole may achieve the desired capacitances by virtue of the capacitors 110 and 112.

For example, the capacitances of the capacitors 106 and 108 may be assumed to be equal (since, for example, the capacitors 106 and 108 may be formed in the same way, in an equivalent area, and using the same types of materials). Similarly, the capacitors 110 and 112 may be assumed to be equal (since, in a similar example, the capacitors 110 and 112 may be formed in the same way, in an equivalent area, and using the same types of materials). Then, using the illustrated notation of FIG. 1A in which capacitors 106, 108, 110, and 112 are labeled respectively as $C_{P1}$, $C_{N1}$, $C_{P2}$ and $C_{N2}$, and where $C_{P1}=C_{N1}$ and $C_{P2}=C_{N2}$, as just explained, then an equivalent capacitance seen between the node 102 and ground is seen as $C_P=C_{P1}+4C_{P2}$, while, similarly, the equivalent capacitance seen between the node 104 and ground is seen as $C_N=C_{N1}+4C_{N2}$. This result flows from the fact that the capacitors 110 and 112 are connected between the differential nodes 102 and 104, so that, during operation of the differential circuit, equal and opposing inputs are applied to the nodes 102 and 104, as explained above. As a result, the capacitors 110 and 112 are seen from the node 102 as being in parallel to ground during each of the differential input cycles, and, therefore (and being equal to one another in this example, as just explained), present the capacitance $4C_{P2}$ in addition to the capacitance $C_{P1}$ of the capacitor 106, at the node 102. Accordingly, in some associated examples, a reduction in area of the space required for the capacitors 106 and 108 may be illustrated using an assumption(s) of 6 fP/μm$^2$ for a capacitive density of the capacitors 106 and 108, and 1 fP/μm$^2$ for the capacitors 110 and 112, in which case an approximately 40% reduction in space may be obtained in the example of FIGS. 1A and 1B, as compared to a case when the capacitors 106 and 108 are used without the capacitors 110 and 112.

Of course, a particular capacitance seen at the nodes 102 and 104 in any particular implementation of the equivalent circuit 100 may vary, depending on, for example, a size and number of differential capacitors that are connected between the nodes 102 and 104. For example, although the two capacitors 110 and 112 are illustrated in the example of FIG. 1A, it should be understood that a different number of capacitors may be used, e.g., only one may be used, or three or more may be used. Additionally, the amount of capacitance provided by any one of the capacitors 106, 108, 110, and 112 may generally be provided at a desired level by virtue of appropriate design choices. In such cases, and others, an equivalent capacitance seen at the nodes 102 and 104 may vary accordingly, as would be apparent.

Thus, in the context of an integrated circuit formed on a substrate, the reduced capacitance required for the capacitors 106 and 108 may be translated into a saving of space that is required for the capacitors 106 and 108 on the substrate of the integrated circuit. For example, in the context of a differential phase-locked loop formed at least partially on a chip, the capacitors 106 and 108 may be reduced in size, while still maintaining a desired capacitance for the filter(s).

Continuing with the example of a differential phase-locked loop, it should be understood that inclusion of the capacitors 106 and 108 on the chip itself (as opposed to having the rest of the phase-locked loop on-chip, and connected to an off-chip filter) allows for compact, discrete construction and packaging of the phase-locked loop, while generally immunizing the phase-locked loop to problems related to off-chip coupling and other sources of undesired electromagnetic emissions that may be problematic when using off-chip components. Accordingly, in the configurations shown and described herein, high performance of a desired differential circuit may be obtained in the context of a single chip, while maximizing space on the chip for circuit elements other than the capacitors 106 and 108.

Figure 1B:
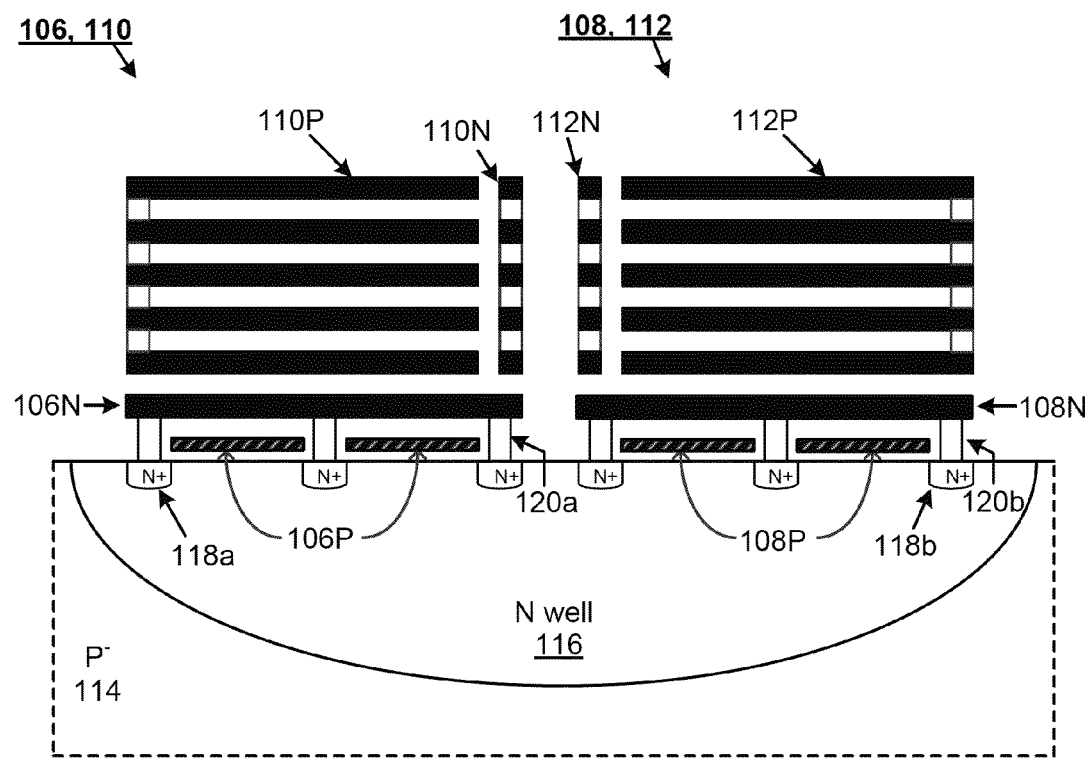
FIG. 1B is a side view of an example of the on-chip capacitor structure of FIG. 1A.

FIG. 1B is a side view of an example of the on-chip capacitor structure of FIG. 1A. In FIG. 1B, portions of the capacitors 106, 108, 110, and 112 are illustrated, using notation and reference numerals matching the above discussion of FIG. 1A. For example, capacitors 106 and 108 are shown as CMOS capacitors, each being constructed of layers 106P/106N and 108P/108N, respectively (along with intervening dielectric layers, not specifically labeled in FIG. 1B).

Capacitors 110 and 112 are shown as metal capacitors (or, more specifically, metal finger capacitors), each being constructed of layers 110P/110N and 112P/112N. FIG. 1B illustrates, from the illustrated sideview, the interdigitated nature of the capacitors 110 and 112 in a vertical direction, where each of the layers 110P and 110N may include multiple, stacked metal layers, each with intervening dielectric layers (not specifically labeled in FIG. 1B, for clarity).

In the context of FIG. 1B and hereafter, it should be understood that the "P" and "N" notations used in designating the above-listed elements of FIG. 1B generally correspond to the positive and negative sides of the illustrated capacitors 106, 108, 110, and 112, as illustrated in FIG. 1A. Such notation may thus be useful in understanding connections between the layers 106P/106N, 108P/108N, 110P/110N and 112P/112N that are so designated. However, it should be understood that this notational convenience is not intended to be limiting in any way, and, as such, ones of the capacitors 106, 108, 110, or 112 may be connected with reversed polarities than those shown, as required or desired in a particular implementation. For example, as referenced above, in some implementations, the capacitors 106 and 108 may be connected to a supply voltage, rather than to ground.

As described and shown below, e.g., with reference to FIG. 2, the layer 106P may be connected to the layer 110P through appropriate vias or other interconnection techniques, in order to establish the corresponding two (of the three) illustrated connections to the node 102 in FIG. 1A. Similarly, the layer 108P may be connected to the layer 112P through vias that are not visible in the side view of FIG. 1B, and may thus establish corresponding connections to the node 104 in FIG. 1A.

Further, examples of connection techniques are provided below, e.g., with respect to FIG. 2, by which the layer 110N may be electrically connected to the layer 108P and the layer 112P, thereby to complete the three illustrated connections to the node 104 in FIG. 1A. Analogously, the layer 112N may be electrically connected to the layer 106P and the layer 110P, to complete the three illustrated connections to the node 102 in FIG. 1A. Accordingly, the equivalent circuit 100 may be implemented in the example of the sideview shown in FIG. 1B.

In the example of FIG. 1B, a P-substrate 114 is shown in which an N well 116 is formed, so that the capacitors 106 and 108 may be formed within the N well 116 and on the substrate 114. Specifically, in the example of FIG. 1B, diffusions 118a and 118b having N+ doping are illustrated, and, as shown, may be connected to the layers 106N and 108N, respectively, by interconnects 120a and 120b, also respectively. In this way, an electrical ground is established at the layers 106N and 108N, matching the equivalent circuit 100 of FIG. 1A.

Thus, the example of FIG. 1B illustrates an example in which the capacitors 110 and 112, formed as metal capacitors, provide for additional capacitance between the node 102 and ground, and between the node 104 and ground. Accordingly, the capacitors 106 and 108, formed as MOS capacitors, occupy a relatively smaller space on a surface of the substrate 114 than may otherwise be required. As a result, advantages of on-chip capacitance (e.g., reduced off-chip coupling or other sources of interference) may be obtained, while increasing a number of other circuit components on the chip, and/or reducing an overall size of the chip.

Figure 2:
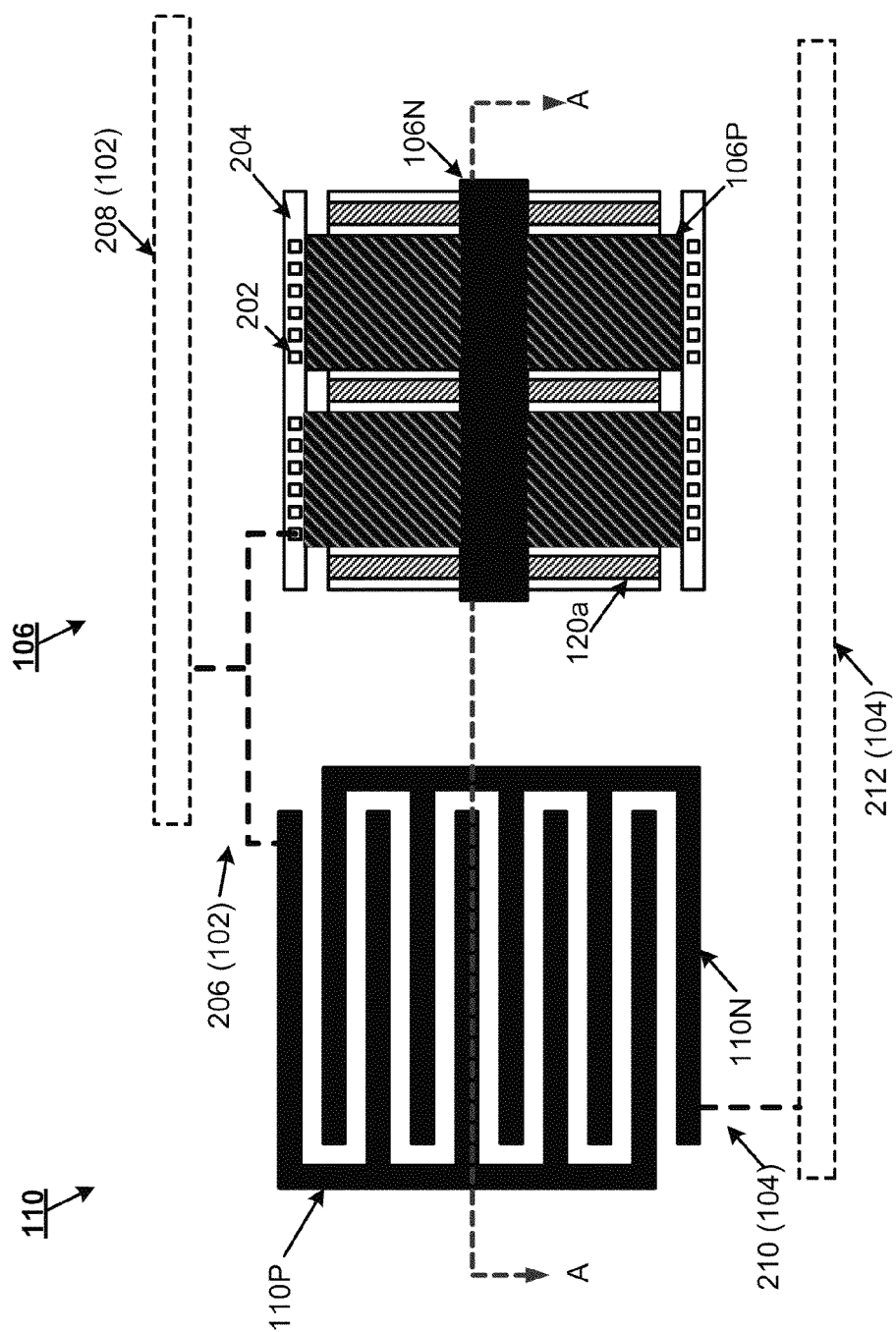
FIG. 2 is a partial and cut-away top view of the on-chip capacitor structure of FIG. 1B.

FIG. 2 is a partial and cut-away top view of the on-chip capacitor structure of FIG. 1B, in which a top view of each of the capacitors 110 and 106 is illustrated. More specifically, the view of FIG. 2 illustrates a top view of both the capacitor 110 and 106, even though, as may be observed from the sideview of FIG. 1B, an actual top view of the structure of FIG. 1B would allow viewing of only the capacitor 110 (since the capacitor 110 overlays the capacitor 106, as shown). Thus, in FIG. 2, the interdigitated nature of the capacitor 110 of FIG. 1B may be seen from above. That is, as shown, individual fingers or extensions of the layers 110P and 110N alternate with one another in the layout, so that, taken together, the examples of FIGS. 1B and 2 illustrate the horizontal and vertical capacitances that may be gained within an area above the underlying (MOS) capacitor 106 in a highly efficient and effective way.

As described above, the capacitor 106 may be a CMOS capacitor, as shown in FIG. 2, which is formed on the underlying substrate 114 of an integrated circuit chip. The example of FIGS. 1B and 2 illustrate examples in which CMOS capacitors include a first type that includes N+ doped diffusions within an N well of a substrate (which may be known as, or referred to as, CNM capacitor(s)). However, in other implementations, a second type that includes P+ diffusions formed in a P well of a substrate (which may be known as, or referred to as, CPM capacitor(s)) may be used.

As illustrated above in FIG. 1B, the capacitor 106 is a CNM-type capacitor that includes the grounded metal electrode 106N that corresponds to the ground potential in FIG. 1A. The layer 106P, which may include, for example, conductive polysilicon, runs perpendicularly underneath the layer 106N, so that, with an inter-lying dielectric layer disposed between the layers 106P and 106N (not visible in FIG. 2), the capacitor 106 is formed as a CMOS capacitor. Further, the contacts 120a are illustrated which lie over and on top of the N+ channels 118a of the capacitor 106, and connect the N+ channels 118a to the electrode 106N.

Vias 202 within a conductive layer 204 may be used to connect the layer 106P of the capacitor 106 with the layer 110P of the capacitor 110, where this interconnect is conceptualized by the connection 206. In other words, as can be seen with respect to FIG. 1A, the layer 106P corresponds to a positive side of the capacitor 106 that is connected to a positive side (i.e., the layer 110P) of the capacitor 110, thereby establishing a common electrical point at the differential node 102.

Further, the layer 106P and/or the layer(s) 110P may be connected directly or indirectly to a metal conductor 208 of the integrated circuit chip, which may be, for example, a metal framing or packaging layer formed on the chip, or any metal present on the chip that provides a convenient connection point(s). Again this connection is illustrated in FIG. 2 by way of the interconnect 206. Thus, the conductor 208 may be used as a convenient way to connect the positive layers 106P and 110P of the capacitors 106 and 110 to the negative layer 112N of the capacitor 112, thereby completing the corresponding three electrical connections at the differential node 102 that are illustrated in FIG. 1A.

As just described, FIG. 2 illustrates a top view of both of the capacitors 106 and 110; however, it should be understood from FIGS. 1A and 1B and the above descriptions that corresponding capacitors 108 and 112 also may be formed in a similar manner, and then cross-connected to arrive at the equivalent circuit 100 of FIG. 1A. Specifically, from the illustration of FIG. 1B, it should be understood that the capacitors 108 and 112 may be made in a largely symmetrical manner to the capacitors 106 and 110 of FIG. 2, and may thus help to provide the various advantages of a differential circuit, as discussed herein.

For example, the positive layer 112P of the capacitor 112 may be connected to the positive layer 108P of the capacitor 108. Then, in cross-connecting the capacitors 108 and 110, a connection 210 may be made to a conductor 212, similar to the conductor 208. In this way, a common electrical point for connection thereto by the negative layer(s) 110N of the capacitor 110 is established, so that the common electrical point is established at which the capacitors 108, 110, and 112 are connected to form the node 104.

Of course, similar connections may be made in other manners, as well. For example, the node 110N may be formed and/or extended across the chip to contact the node 112P, and the node 112N may similarly be extended to contact the node 110P. Alternatively, the negative layers 110N and 112N may be extended over the opposite (CMOS) capacitors (i.e., 108 and 106, respectively), and then dropped through vias 202 (or similar interconnects) to connect to the positive layers 108P and 106P, respectively, of the opposing capacitors 108 and 106. In such examples, connections to the conductors 208 and/or 212 may not be required.

Figure 3:
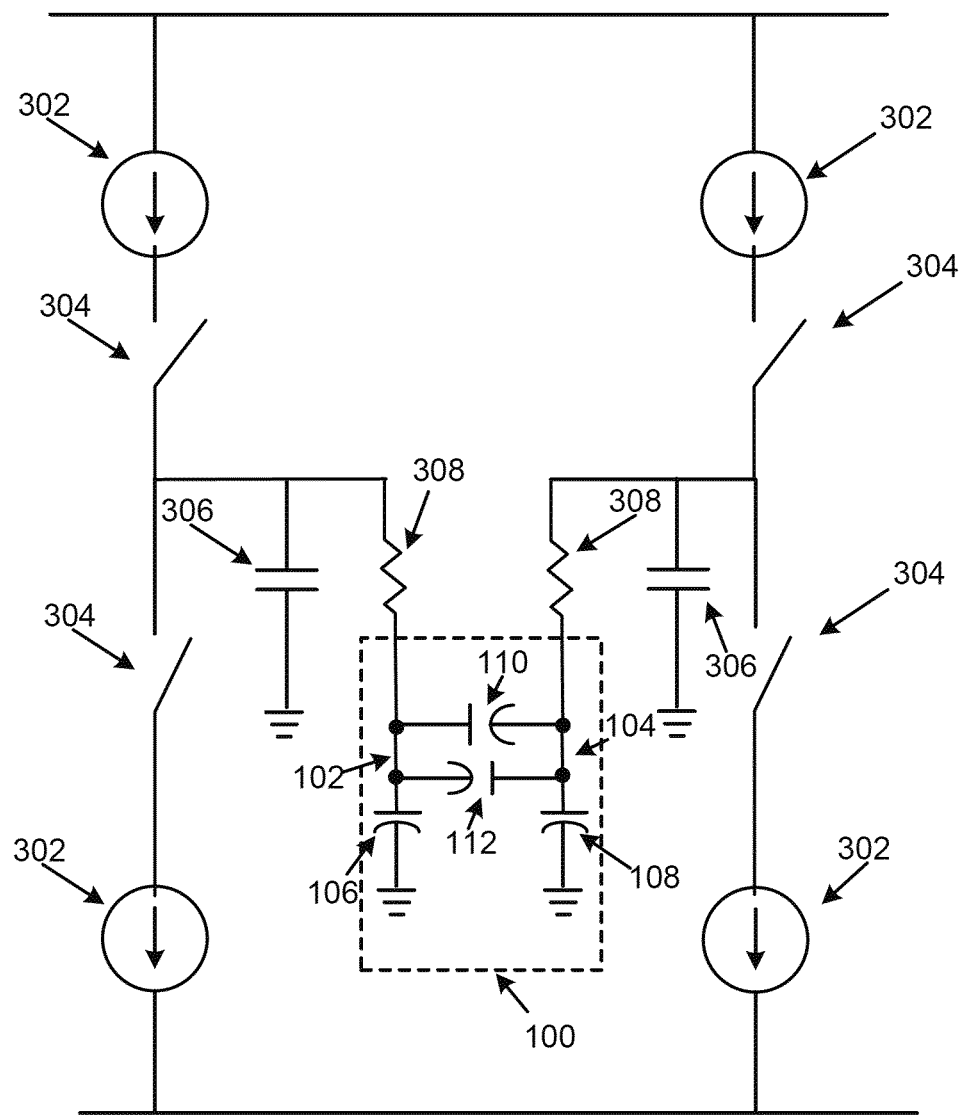
FIG. 3 is a circuit diagram of a partial phase-locked loop circuit using the circuit and structure of FIGS. 1A, 1B, and 2.

FIG. 3 is a circuit diagram of a partial phase-locked loop circuit using the circuit 100 of FIG. 1A and the structure(s) of FIGS. 1B and 2. That is, FIG. 3 generally represents a portion of a phase-locked loop circuit that is useful in understanding an example implementation of the equivalent circuit 100 of FIG. 1A, as implemented using the example structures of FIGS. 1B and 2. However, it should be understood that other elements of an entire phase-locked loop circuit may be included in the design of a corresponding integrated circuit, as would be apparent.

Generally, a phase-locked loop circuit may include a voltage-controlled oscillator (VCO) that receives, and is controlled by, a tuning voltage received from a filter that is operating on current received from a charge pump. The VCO may thus output frequency and/or phase information back to a detector and/or comparator circuit for comparison against a (desired) reference signal frequency/phase, and the detector and/or comparator may thus control the charge pump accordingly. In other words, the phase-locked loop provides a closed-loop feedback system that maintains an output signal in a fixed phase relationship with a reference signal.

FIG. 3 generally illustrates portions of such a differential phase-locked loop, where the specific illustrated portions are related to the charge pump and/or filtering aspects just described. That is, charge pump circuit elements include current sources 302 and switches 304, which may be operated in a known manner to provide a desired current/voltage to filter elements including capacitors 306, resistors 308, and the circuit elements of the equivalent circuit 100, as shown. For example, the charge pump circuit elements 302 and 304 may be operated in response to frequency or phase information resulting from a comparison of an output signal with a reference signal, and the filter elements 306, 308, and 102-112 may operate on the signal(s) provided by the charge pump circuit elements 302 and 304 to control a voltage controlled oscillator (not shown).

Thus, in FIG. 3, the differential nodes 102 and 104 represent differential nodes of the larger capacitors for the differential phase-locked loop filter. When such a circuit is constructed (at least partially) in an integrated circuit on a chip, the filter capacitors 106 and 108 may be reduced in size when the capacitors 110 and 112 are included as shown (and as described above), since the capacitors 110 and 112 provide additional capacitance while being constructed on top of, or above, the filter capacitors 106 and 108, respectively, on the integrated circuit chip (thereby not requiring any additional space on the surface of the substrate 114 of the chip). In this way, additional space may be created on the substrate 114 for other circuit elements, and/or the overall size of the chip may be reduced. Additionally, a similar capacitor structure may be applied to differential capacitors 306 (e.g., using metal capacitors not specifically illustrated in FIG. 3), thereby providing advantages that are similar in nature (e.g., reduced footprint of the capacitors 306) but lessened in extent (since the capacitors 306 are generally smaller than the capacitors 106 and 108) relative to the example of the circuit 100.

Figure 4:
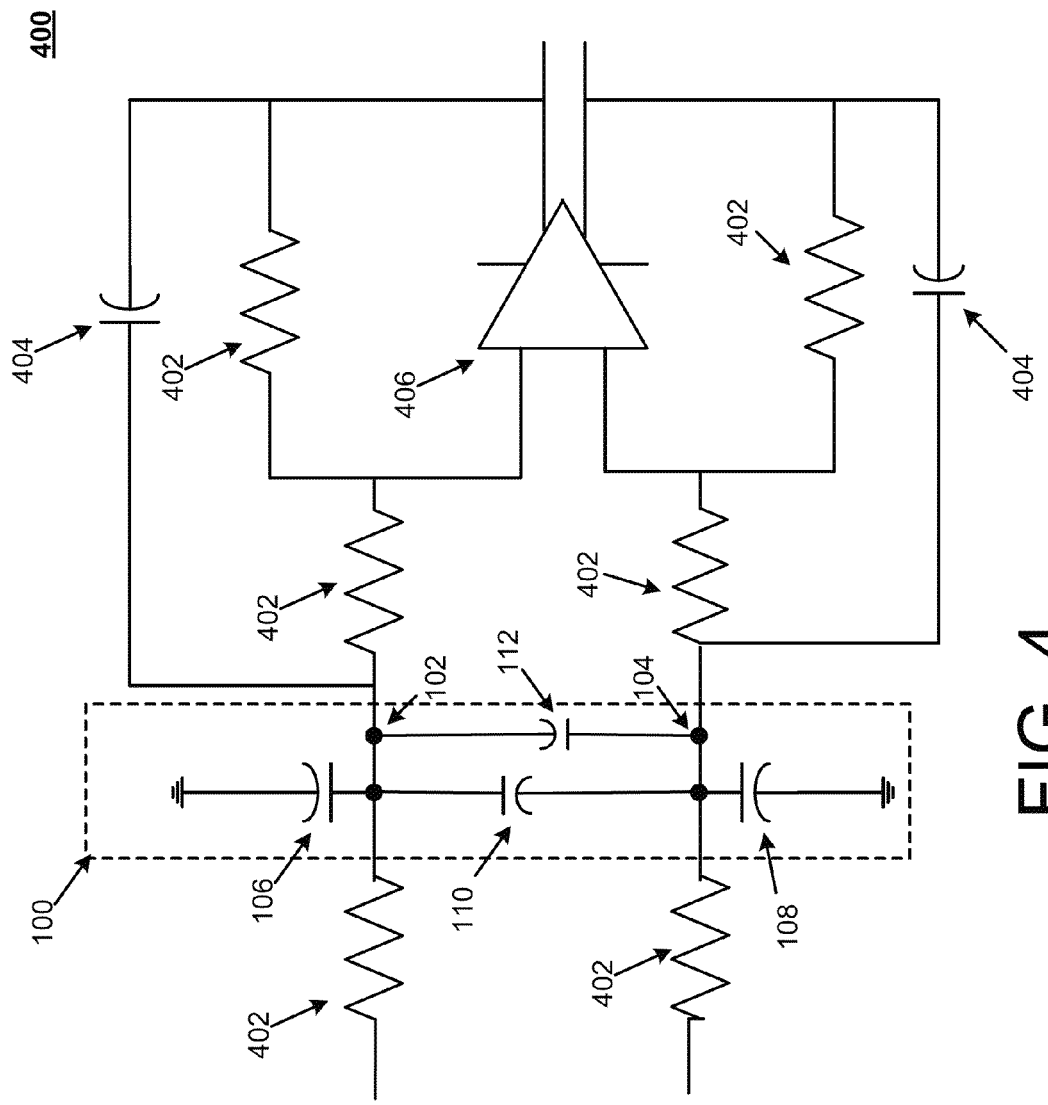
FIG. 4 is a circuit diagram of a filter circuit using the circuit and structure(s) of FIGS. 1A, 1B, and 2.

FIG. 4 is a circuit diagram of a filter circuit 400 using the circuit and structure(s) of FIGS. 1A, 1B, and 2. The filter circuit 400 may represent, for example, a differential, second-order, active resistive-capacitive (RC) filter. As with the phase-locked loop circuit elements of FIG. 3, FIG. 4 and the associated description herein are not intended to provide a detailed explanation of the overall structure and operation of the filter circuit 400. Rather, again, the filter circuit 400 is merely intended as an example of a context in which the equivalent circuit 100 (and associated structures of the examples of FIGS. 1B and 2) may be used.

The filter circuit 400 includes various resistors 402 and capacitors 404, which are connected directly or indirectly to a differential operational amplifier 406. Generally speaking, the filter circuit 400 operates to filter or remove undesired frequency components from an input signal, for output of the remaining components by the operational amplifier 406.

As shown, the equivalent circuit 100 may be implemented with respect to the differential nodes of the operational amplifier 406, which are labeled again as the differential nodes 102 and 104. Then, as described herein, an equivalent capacitance seen at the capacitors 106 and 108, respectively, may be increased relative to capacitance values that would be present without the capacitors 106 and 108. Additionally, or alternatively, a size of the capacitors 106 and 108 may be reduced on a substrate on which the filter circuit 400 is formed.

FIGS. 5A-5D are a sequence of views illustrating example methods for forming the layout(s) of FIGS. 1B and 2. Specifically, FIGS. 5A-5D illustrate techniques for forming the capacitors 106 and 110 to obtain corresponding portions of FIGS. 1B and 2. However, it should be understood that similar techniques may be used with respect to the construction of the capacitors 108 and 112.

In FIGS. 5A-5D, various operations that are conventional to CMOS capacitor processing, or to CMOS processing in general, may not be illustrated or discussed, for the sake of clarity. Further, although various examples of specific fabrication materials and techniques are provided below, it should be understood that any appropriate material(s) and/or technique(s) may be used, as would be apparent.

Figure 5A:
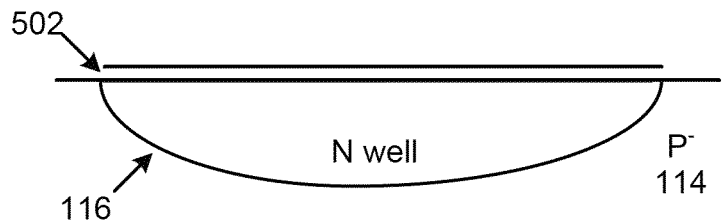
FIGS. 5A-5D are a sequence of views illustrating example methods for forming the layout(s) of FIGS. 1B and 2.

In FIG. 5A, the N well 116 is formed in the P-substrate 114, by, for example, ion implantation and/or diffusion into an area(s) exposed by a photoresist (not shown in FIG. 6A), which may then be removed. Then, a dielectric layer 502, such as, for example, silicon dioxide, may be grown by an oxidation process, or otherwise formed by one or more of a number of known techniques.

Figure 5B:
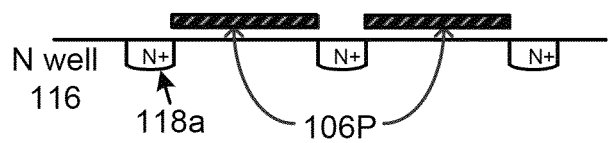

To arrive at the formation stage of FIG. 5B, polysilicon layers 106P may be formed by known techniques including, for example, deposition techniques such as chemical vapor deposition or sputtering. Then, portions of the polysilicon layers 106P and underlying oxide may be etched or otherwise removed, so that an ion implantation of the N+ diffusions 118a may occur (e.g., using the layers 106P as masking layer). In some implementations, only a single layer of polysilicon may be formed, as opposed to the dual-layer structure of FIGS. 1B, 2, and 5B-5D. Conversely, in other implementations, more than two layers may be used. For example, in a notation where "W" represents a channel width of the layer(s) 106P, and "L" a channel length, a multiplier M may applied to a unit capacitance $C_{UMOS}$ of the capacitor 106, so that a total capacitance of the capacitor 106 may be seen to be $W*L*M*C_{UMOS}$. As a result, it may be advantageous to include multiple layers 106P, where feasible.

Figure 5C:
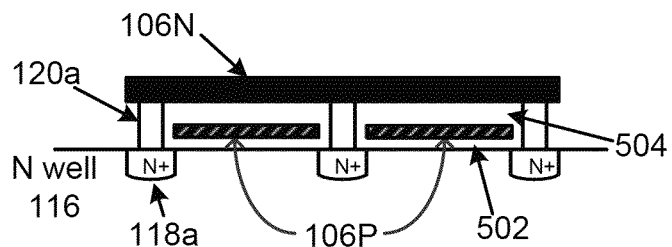

In FIG. 5C, metal contact layers 120a, e.g., aluminium or copper, may be formed above the N+ diffusions 504. A dielectric layer 504 may then be formed, which may be, for example, silicon nitride or any other suitable dielectric material, using known deposition/sputtering techniques Finally in FIG. 5C, a suitable metal, such as, for example, aluminum or copper, may be used to form the layer 106N, again using known techniques, such as deposition or sputtering.

Figure 5D:
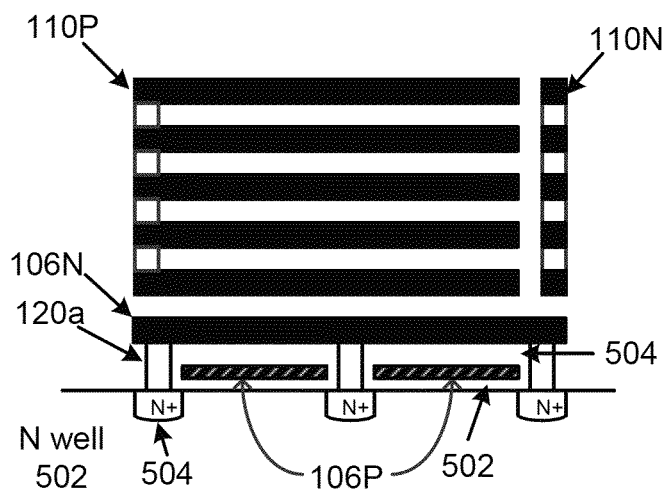

In FIG. 5D, layers 110P and 110N of the capacitor 110 may be formed, according to known methods for forming interdigitated, metal capacitors. Although not viewable in the sideview of FIG. 5D, it should be understood that the layers 106P may then be connected to the layer 110P through vias that are formed therebetween, and both of the layers 106P and 110P may be established as connected to the differential node 102, along with the negative layer 112N of the capacitor 112 (e.g., by the conductor 208, as shown in FIG. 2). Similarly, the layer 110N may be connected, by way of a conductive material (e.g., the conductor 212 of FIG. 2) to the layer 112P of the capacitor 112, which is connected by via to the layer 108P of the CMOS capacitor 108, to establish the differential node 104.

Figure 6:
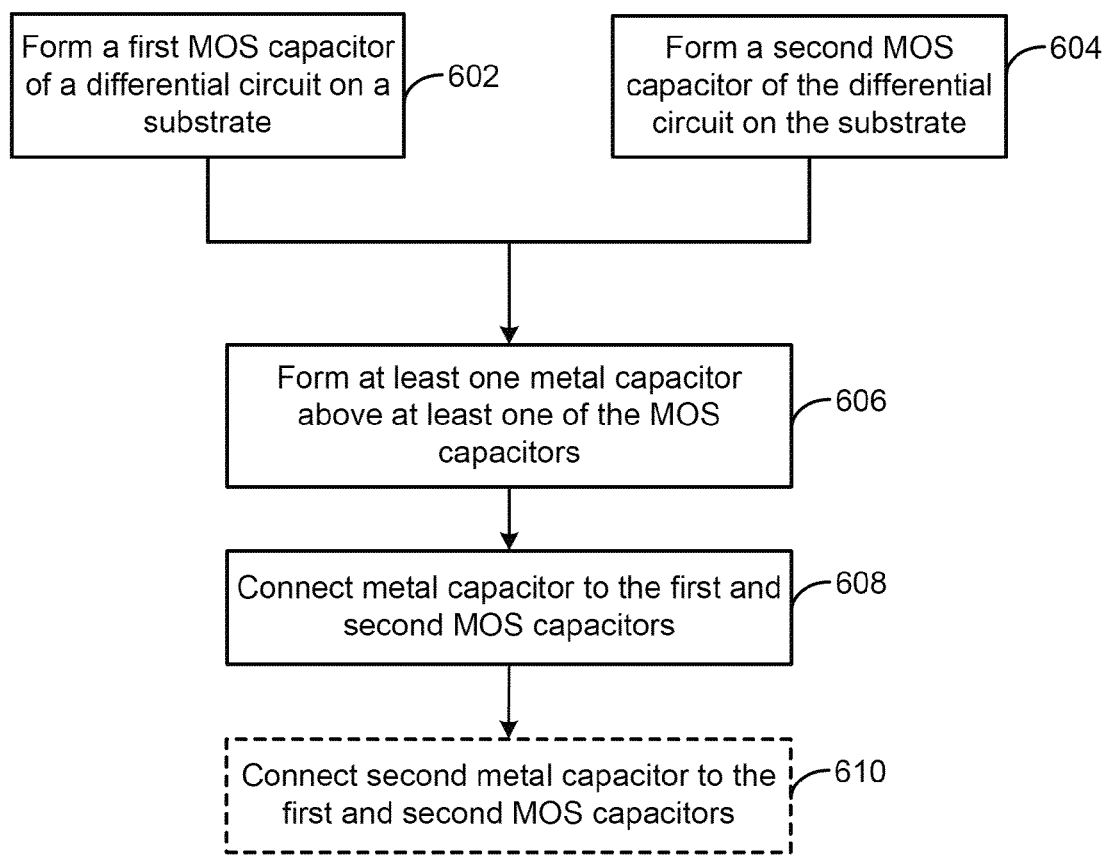
FIG. 6 is a flowchart illustrating an operation for forming the structures of FIGS. 1B and 2, in accordance with the example method(s) of FIGS. 5A-5D.

FIG. 6 is a flowchart 600 illustrating an operation for forming the structures of FIGS. 1B and 2, in accordance with the example method(s) of FIGS. 5A-5D. In FIG. 6, a first MOS capacitor of a differential circuit may be formed on a substrate (602), simultaneously with a second MOS capacitor that is also formed on the substrate (604). For example, as described, the capacitors 106 and 108 may be formed as CMOS capacitors that on the substrate 114, along with at least some other components of a differential circuit, such as, for example, the (partially-illustrated) phase-locked loop circuit 300 of FIG. 3, and/or the filter circuit 400 of FIG. 4. For example, the capacitors 106 and 108 may be formed according to the method(s) of FIGS. 5A-5C, or by other methods, as would be apparent.

At least one metal capacitor may then be formed above at least one of the MOS capacitors (606). For example, the capacitor 110 may be formed above one or both of the capacitors 106 and/or 108, or, as in the examples of FIGS. 1B and 2, two or more capacitors 110 and/or 112 may be formed above the capacitors 106 and 108, respectively.

The at least one metal capacitor may then be connected to the first and second MOS capacitors (608), perhaps at differential nodes to which the first and second capacitors are connected. For example, the capacitor 110 may be connected to the capacitor 106 and the capacitor 108, at differential nodes 102 and 104, respectively. As in the examples of FIGS. 1B and 2, such connections may be made through vias 202 or other interconnection methods. For example, as in FIG. 2, the negative layer 110N of the capacitor 110 may be connected to a positive layer 108P of the capacitor 108, using an available conductor, such as the conductor 212 (which may be, for example, associated with a frame of the integrated circuit chip). It should be understood from the example of FIG. 2 that such a connection may include, or be associated with, a connection to a positive layer 112P of a second metal capacitor, when such a capacitor is included.

In a case where such a second metal capacitor is used, then the second metal capacitor also may be connected to the first and second MOS capacitors (610). For example, the capacitor 112 also may be connected to the capacitor 106 and the capacitor 108, at differential nodes 102 and 104, respectively. As just referenced, such connections may be made through vias 202 or other interconnection methods. For example, as in FIG. 2, the negative layer 112N of the capacitor 112 may be connected to a positive layer 106P of the capacitor 106, using an available conductor, such as the conductor 208 (which may be, similarly to the example above, associated with a frame of the integrated circuit chip). The connection of the negative layer 112N with the positive layer 106P may be provided by, or associated with, a common connection to a positive layer 110P of the first metal capacitor 110.

As described, then, the capacitors 110 and/or 112 may be formed and/or referenced in various examples as metal-insulator-metal capacitors, metal capacitors, metal plate capacitors, metal finger capacitors, and/or metal comb capacitors. For example, in various implementations, any one or more of such capacitors may be formed between the differential nodes 102 and 104. In particular, for example, metal plate capacitors may be formed above the capacitors 110 and 112 (and interconnected between the nodes 102 and 104), thereby forming three different types of capacitors in a vertical stack. For example, in some implementations, metal used in forming the integrated circuit may be available to form metal capacitors (e.g., using two layers of metals on either side of a dielectric), while other unused metal in the construction may be used to form metal finger capacitors. In other implementations, the metal finger capacitors may be formed above both metal plate capacitors and the MOS capacitors (i.e., on top of the metal plate capacitors). In this way, additional savings of area on the integrated circuit may be obtained In the implementations described herein, integrated circuits may be constructed with on-chip capacitor structures that help maximize an amount of available space on the chip for other components, and/or minimize an amount of space for the capacitor structures. In this way, an amount of circuitry that may be placed on the chip may be increased, and/or an overall size of the chip may be reduced.

By forming CMOS capacitors on a substrate of the chip, a high capacitance density may be obtained (e.g., 6 fP/$\mu m^2$ for 0.13 $\mu m$ CMOS processes). By forming metal capacitor(s) above the CMOS capacitors and between differential nodes of a differential circuit that includes the CMOS capacitors, an equivalent capacitance seen at the differential nodes may be increased for a given capacitance of the CMOS capacitors. In these examples, then, the above-described advantages associated with an effective increase in an amount of available chip space may be obtained.

Figure 7:
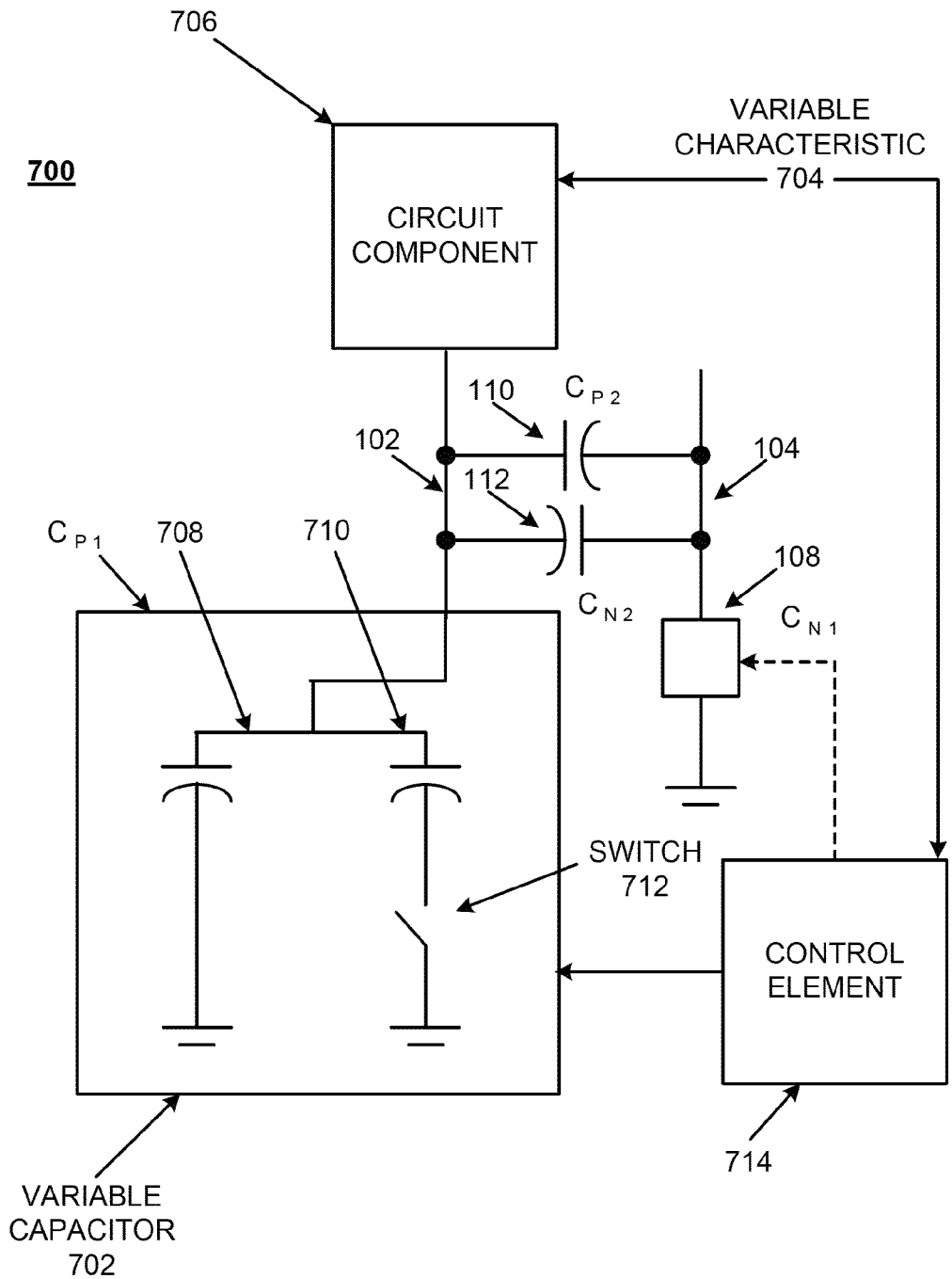
FIG. 7 is a circuit diagram of an equivalent circuit for an on-chip capacitor structure with adjustable capacitance.

FIG. 7 is a circuit diagram of an equivalent circuit 700 for an on-chip capacitor structure which provides an adjustable capacitance capability. That is, the circuit 700 may include, for example, a number of capacitors (and other elements) that may be formed in an integrated circuit, as part of a larger differential circuit. By virtue of the various structures that are described herein for implementing the equivalent circuit 700, not only may an amount of space on the chip/substrate be conserved, but also the effective capacitance of the equivalent circuit 700 may be dynamically adjusted (e.g., increased or decreased) during an operation of the equivalent circuit 700. As a result, a stability and operation of the equivalent circuit 700 may be improved, even, for example, in the presence of varying operating characteristics of circuit elements connected to the equivalent circuit 700.

In FIG. 7, and analogously to FIG. 1, the node 102 and the node 104 represent differential nodes of a larger differential circuit. Also in FIG. 7, at least a first capacitor 702 is shown as being connected to the node 102, where the at least a first capacitor 702 may include more than one capacitor, as shown. In other words, it should be understood that any reference to "a capacitor" may be understood to mean "at least one" capacitor, or to mean "one or more capacitors." A total or combined capacitance of the at least a first capacitor 702 may vary, for example, in response to a variable characteristic 704 associated with a circuit component 706.

That is, in the example of FIG. 7, the at least a first capacitor 702 includes two capacitors 708 and 710, and a switch 712 is in place between the capacitor 710 and ground, as shown. A control element 714 is operable to open or close the switch 712 in response to the variable characteristic 704 associated with the circuit component 706, so that, as a result, the total or combined capacitance seen between the node 102 and ground may be adjusted (e.g., increased or decreased) in response to the variable characteristic (where, as discussed in more detail below, the variable characteristic 704 may include, for example, a frequency, temperature, or voltage associated with the circuit component 706, and the circuit component 706 may include, for example, a resistor or a transistor).

In some example implementations (not shown in FIG. 7 for brevity), the differential nature of the larger differential circuit to which the equivalent circuit 700 may be connected may imply a symmetry in which the node 104 also may be associated with variable capacitor(s) that are equivalent to the (variable) at least a first capacitor 702. For example, in such implementations, the capacitor 108 may represent a plurality of capacitors, where a switch associated with at least one of the plurality of capacitors may be connected/used, similarly to the switch 712, to adjust a total capacitance associated with the (at least one) capacitor 108, as this total capacitance is seen between the node 104 and ground. Thus, in such example implementations, a total capacitance 108 may be adjusted in response to a variable characteristic corresponding to the variable characteristic 704, but associated with circuit component(s) connected to the node 104. Further in such implementations, the variable capacitors 702, 108 on each node 102 and 104, respectively, may have their corresponding switches opened and closed at the same time by the control element 714. A specific example in which symmetrically-varying capacitances are seen at the nodes 102, 104 is illustrated and discussed below with respect to FIG. 8.

In FIG. 7, the capacitors 708/710, and 108 are illustrated as being connected between the differential nodes 102 and 104, respectively, and ground. It should be understood, however, that the capacitors 708/710 and 108 also may be connected to a power supply voltage, depending, for example, on a desired configuration and/or circuit type of the larger differential circuit. The capacitors 708/710 and 108 may generally be used, for example, in conjunction with other circuit components (e.g., the circuit component 706 and/or similar, symmetrically-disposed circuit component(s) connected to the node 104) in order to provide various types of filtering or smoothing operations with respect to input voltage(s) of a differential circuit. For example, the capacitors 708/710 and 108 may be used in conjunction with appropriate circuit components to provide a low-frequency bandpass filter, or a filter bi-quad, where such circuits use one or more of the herein-described on-chip capacitor structures with adjustable capacitances.

Thus, in the example of FIG. 7, the capacitors 708 and 710 are included in the variable capacitor 702 and are connected in parallel. As described, when the control element 714 sends the appropriate signal, the switch 712 is opened or closed. When the switch 740 is open, the variable capacitor 702 has a different effective capacitance than when the switch 712 is closed. As also already described, the capacitor 108 also may be substantially identical (either in effective capacitance or in actual structure) to the variable capacitor 702, and the control element 710 may send signals to adjust both variable capacitors 702/108, e.g., substantially identically.

The control element 714 may operate in a number of manners. For example, the control element 714 may include, for instance, hardware, software, and/or firmware associated with instructions capable of causing the switch 712 to open or close. A series of registers may be used, in another example, wherein the registers may be used to reproduce binary states of off and on to reproduce strings of zeroes and ones and thereby form a binary control signal, as with, e.g., a binary weighted capacitor.

The capacitors 708/710 and 108 may be implemented as metal-oxide-semiconductor (MOS) capacitors formed on a substrate of an integrated circuit chip, or as complementary metal-oxide-semiconductor (CMOS) capacitors. Such capacitors generally have a high capacitance density (i.e., a large amount of capacitance per unit area), and may generally be formed in a straight-forward manner as part of a larger MOS or CMOS processing of the chip as a whole. Such capacitors generally require a connection to ground or to a supply voltage, and consume a relatively large amount of surface area of the substrate on which they are formed, and on which some or all of the rest of the larger differential circuit may be formed.

Finally in FIG. 7, capacitors 110 and 112 are connected between the nodes 102 and 104, respectively. In FIG. 7 and in the following examples, the capacitors 110 and 112 may be formed as metal-insulator-metal (MIM) capacitors. Additionally, or alternatively, the capacitors 110 and 112 may be formed as metal finger capacitors or metal comb capacitors, in which the finger and/or comb structures include symmetrical, opposed digits that face one another and are interdigitated (e.g., inserted between one another to form alternating layers of metal and insulating material, in a horizontal and/or vertical direction(s)).

As shown in FIG. 7, the capacitors 110 and 112 may be formed as floating-point capacitors that are connected between the differential nodes 102 and 104 and do not require a connection either to a supply voltage or to ground. As described and illustrated in more detail herein, the capacitors 110 and 112 may take advantage of a differential nature of the larger differential circuit to obtain the illustrated configuration(s) of FIG. 7, using a convenient, easily-formed, and reliable connection to the underlying capacitors 708/710, and 108 (e.g., CMOS capacitors).

The capacitors 110 and 112, in the context of the larger differential circuit, cause equivalent capacitances seen between the differential node 102 and ground, and between the differential node 104 and ground, to be greater than would occur if the capacitors 110 and 112 were not included. As a result, for example, the capacitors 708/710 and 108 may require a smaller capacitance than would otherwise be required for a given circuit, since the equivalent circuit 700 as a whole may achieve the desired capacitances by virtue of the capacitors 110 and 112.

Of course, a particular capacitance seen at the nodes 102 and 104 in any particular implementation of the equivalent circuit 700 may vary, depending on, for example, a size and number of differential capacitors that are connected between the nodes 102 and 104. For example, although the two capacitors 110 and 112 are illustrated in the example of FIG. 7, it should be understood that a different number of capacitors may be used, e.g., only one may be used, or three or more may be used. Additionally, the amount of capacitance provided by any one of the capacitors 708/710, 108, 110, and 112 may generally be provided at a desired level by virtue of appropriate design choices. In such cases, and others, an equivalent capacitance seen at the nodes 102 and 104 may vary accordingly, as would be apparent.

Thus, in the context of an integrated circuit formed on a substrate, the reduced capacitance required for the at least one variable capacitor 702 (e.g., comprising the capacitors 708/710) and the at least one capacitor 108 may be translated into a saving of space that is required on the substrate of the integrated circuit. For example, in the context of a differential, low-frequency bandpass filter at least partially on a chip, the capacitors may be reduced in size, while still maintaining a desired capacitance for the filter(s).

Furthermore, the space saving benefits of the equivalent circuit 700 may be used where conditions on a microchip dictate that many capacitors should be implemented on the chip. In many differential filters, for example, inputs to the single-ended or differential circuits, or combinations of circuits, have a large range of operating characteristics, like very low or very high frequencies, voltages, temperatures, or other process related characteristics. In some such scenarios, many capacitors may be used to respond to such large ranges of operating characteristics. In such settings, the effective capacitance of the capacitors may benefit from being changed, e.g., when the inputs of the single-ended or differential circuits change, or when the chip needs to be calibrated. At the same time, the total space for all of the capacitors on the microchip needs to be minimized, so that devices that operate using the chips may be made as small as possible. Thus, as already described, some example implementations respond to such an environment by using the equivalent circuit 700, which saves space but also uses, for example, the control element 714 to activate and deactivate switches to change the overall capacitance seen at one of the differential nodes 102 and 104 when the input(s) to those differential nodes change(s).

Figure 8:
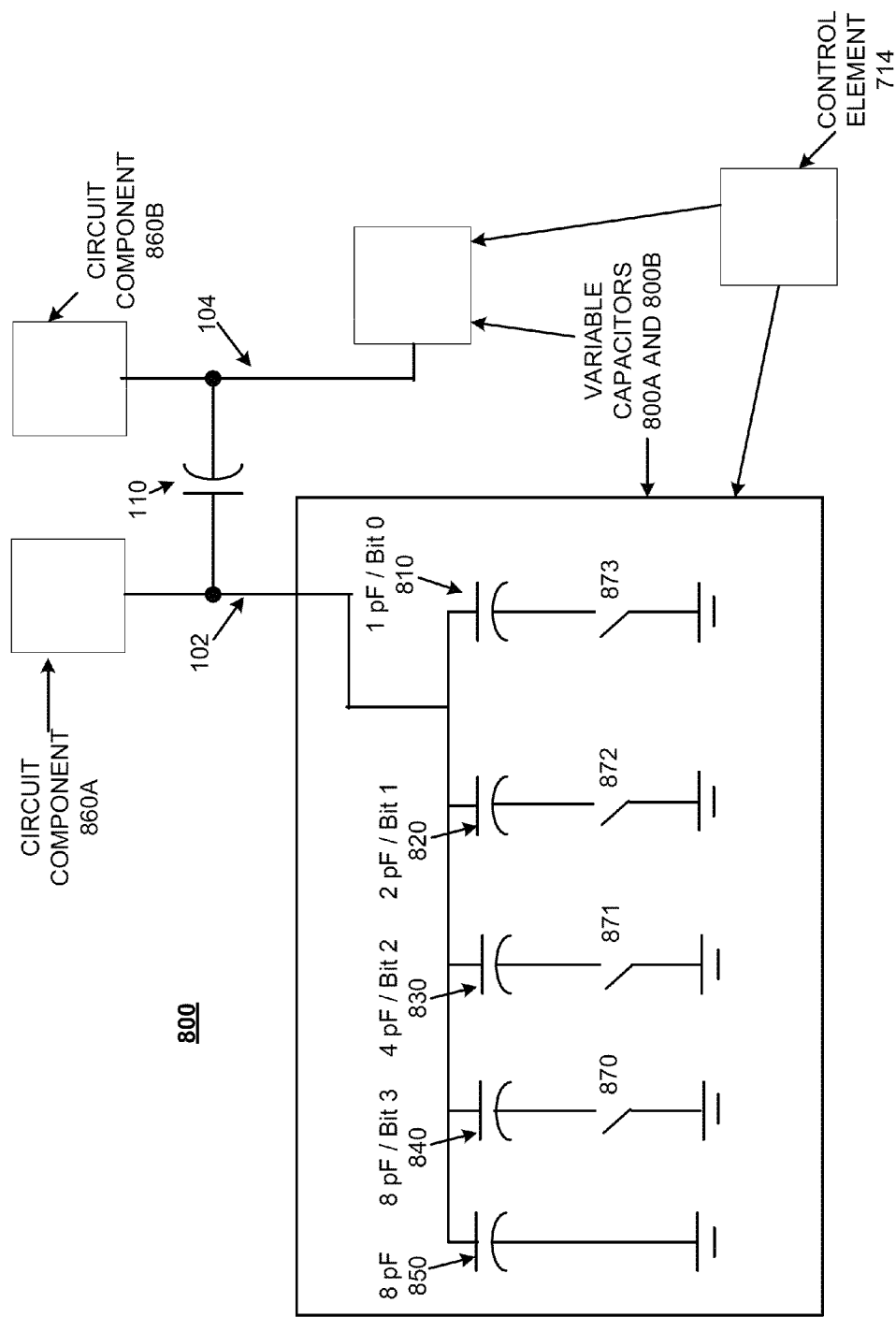
FIG. 8 is a circuit diagram of an equivalent circuit for an on-chip capacitor structure with adjustable capacitance.

FIG. 8 is a circuit diagram of an example implementation of an equivalent circuit 800 for an on-chip capacitor structure which provides an adjustable capacitance capability. As referenced above, FIG. 8 illustrates an example in which a symmetry of the larger differential circuit is maintained and illustrated. Thus, in FIG. 8, the node 102 and the node 104 are shown, which, as above, represent differential nodes of a larger differential circuit (e.g., the differential circuit(s) of FIG. 3 or 4). In the example of FIG. 8, each node 102 and 104 has a circuit component 860A and 860B, respectively, as input, and a (at least one) variable capacitor 800A and 800B, also respectively, shown as being connected to ground. In the example of FIG. 8, each of the (at least one) variable capacitor(s) 800A and 800B includes a plurality of capacitors 810, 820, 830, 840, and 850 (not illustrated with respect to the variable capacitor 800B, for the sake of brevity). Of the capacitors 810-850, the capacitors 810-840 are also connected to switches 870, 871, 872, and 873, as shown. As should be understood from the above description of FIG. 7, the control element 714 is operably connected to switches 870-873 of the variable capacitors 800A and 800B.

In operation, circuit components 860A and 860B represent, for example, conductive elements, filters, transistors, or other circuit components, which have a variable characteristic that needs to be compensated for either during use, during calibration, or elsewhere. For example, in one application, circuit components 860A and 860B may operate in a low frequency range and may exhibit a variation in frequency that may exceed one-hundred fifty percent. In other examples, circuit components 860A and 860B may represent virtually any circuit component, which exhibits a variable characteristic like temperature, voltage, or other process-related characteristic. When the circuit components 860A and 860B vary, it may be desirable to change the effective capacitance of variable capacitors 800A and 800B, typically by substantially identical amounts and at approximately the same time.

In one example application, the components 860A/860B may represent a component "Gm0" that varies in the context of a filter, even though it is desirable in the filter application to maintain a state defined by Equation 1 (in which a constant A is included to represent the proportionality of the relationship), e.g., in order to maintain correct calibration:

$$\text{Frequency} = A(Gm0/\text{Effective Capacitance}) \qquad \text{Equation 1:}$$

Thus, to maintain Equation 1 and/or to calibrate the chip, effective capacitance should be changed when Gm0 varies. In some applications, then, if Gm0 becomes vary large, the number of capacitors on a microchip may also become undesirably large, making a structure as shown in FIG. 7 or 8 particularly advantageous for their benefit of reduced size and/or their ability to change effective capacitance outputs over a broad range, since this will reduce the amount of space the capacitors occupy on the overall chip.

Thus, in the example of FIG. 8, variable capacitors 810-840 include switches 870-873 which are operably connected to the control element 714. In one example, the control element 714 uses a 4 bit control signal. In this example, then, bit 0 may open switch 873 on capacitor 810, while bit 1 opens switch 872 on capacitor 820, bit 2 opens switch 871 on capacitor 830, and bit 3 opens switch 870 on capacitor 840.

As a result, when all 4 bits are zero, the switches 870-873 are all open, so only 8 pF of effective capacitance is presented from variable capacitor 800A via 8 pF capacitor 850, which has no switch and represents the baseline minimum capacitance output from the variable capacitor blocks 800A and 800B. Similarly, when all 4 bits are one, the switches 870-873 are all closed, so 23 pF of effective capacitance is presented from variable capacitor 800A via each capacitor 810-850, representing the maximum capacitance output from the variable capacitor blocks 800A and 800B (i.e., 8 pF+8 pF+4 pF+2 pF+1 pF).

Table 1 represents all of the control signals used by control element 710 in the present example:

TABLE 1

| Control Signal | Switch 873 | Switch 872 | Switch 871 | Switch 870 | Effective Capacitance |
|---|---|---|---|---|---|
| 0000 | Open | Open | Open | Open | 8 pF |
| 0001 | Closed | Open | Open | Open | 9 pF |
| 0010 | Open | Closed | Open | Open | 10 pF |
| 0011 | Closed | Closed | Open | Open | 11 pf |
| 0100 | Open | Open | Closed | Open | 12 pF |
| 0101 | Closed | Open | Closed | Open | 13 pF |
| 0110 | Open | Closed | Closed | Open | 14 pf |
| 0111 | Closed | Closed | Closed | Open | 15 pf |
| 1000 | Open | Open | Open | Closed | 16 pf |
| 1001 | Closed | Open | Open | Closed | 17 pf |
| 1010 | Open | Closed | Open | Closed | 18 pf |
| 1011 | Closed | Closed | Open | Closed | 19 pf |
| 1100 | Open | Open | Closed | Closed | 20 pf |
| 1101 | Closed | Open | Closed | Closed | 21 pf |
| 1110 | Open | Closed | Closed | Closed | 22 pf |
| 1111 | Closed | Closed | Closed | Closed | 23 pf |

Therefore, in the example of FIG. 8, each variable capacitor 800A and 800B has an effective capacitance, which ranges from 8 pF to 23 pF. The variable capacitors have total range of 16 pF (i.e., 23 pF–8 pF). The midpoint is at 16 pF capacitance on the control signal 1000. The 8 pF and 23 pF capacitance ranges therefore, may be used to provide 16 pF plus or minus 8 pF, for an effective capacitance variation in this example of plus or minus fifty percent.

Figure 9:
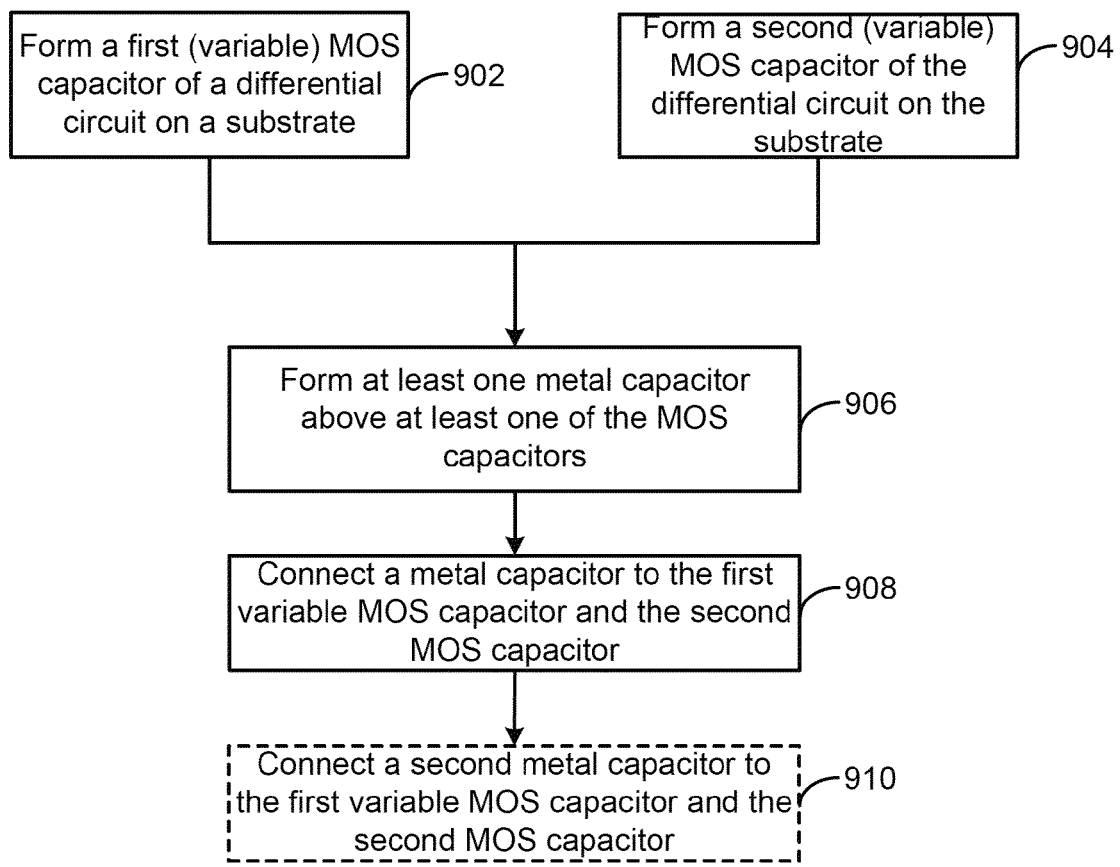
FIG. 9 is a flowchart illustrating an operation for forming the structures of FIGS. 7 and 8, in accordance with the example method(s) of FIGS. 5A-5D.

FIG. 9 is a flowchart illustrating an operation for forming the structures of FIGS. 7 and 8, in accordance with the example method(s) of FIGS. 5A-5D. In FIG. 9, at least a first MOS capacitor of a differential circuit may be formed on a substrate, where the first MOS capacitor is variable (902), substantially simultaneously with a second MOS capacitor (which may optionally be variable as well) that is also formed on the substrate (904). For example, as described, the capacitors 106 and 108 may be formed as CMOS capacitors that on the substrate 114, along with at least some other components of a differential circuit, such as, for example, the (partially-illustrated) phase-locked loop circuit 300 of FIG. 3, and/or the filter circuit 400 of FIG. 4. For example, the capacitors 106 and 108 may be formed according to the method(s) of FIGS. 5A-5C, or by other methods, as would be apparent. Further, appropriate switches and/or control element(s) may be formed in order to effect the variability of the MOS capacitor(s), as described herein.

At least one metal capacitor may then be formed above at least one of the MOS capacitors (906). For example, the capacitor 110 may be formed above one or both of the capacitors 106 and/or 108, or, as in the examples of FIGS. 1B, 2, 7 and 8, two or more capacitors 110 and/or 112 may be formed above the capacitors 106 and 108, respectively.

The at least one metal capacitor may then be connected to the first variable MOS capacitor and the second MOS capacitor (908), perhaps at differential nodes to which the first and second capacitors are connected. Then, a second metal capacitor (and any additional metal capacitors) may be connected to the first variable MOS capacitor and the second MOS capacitor (910).

Figure 10:
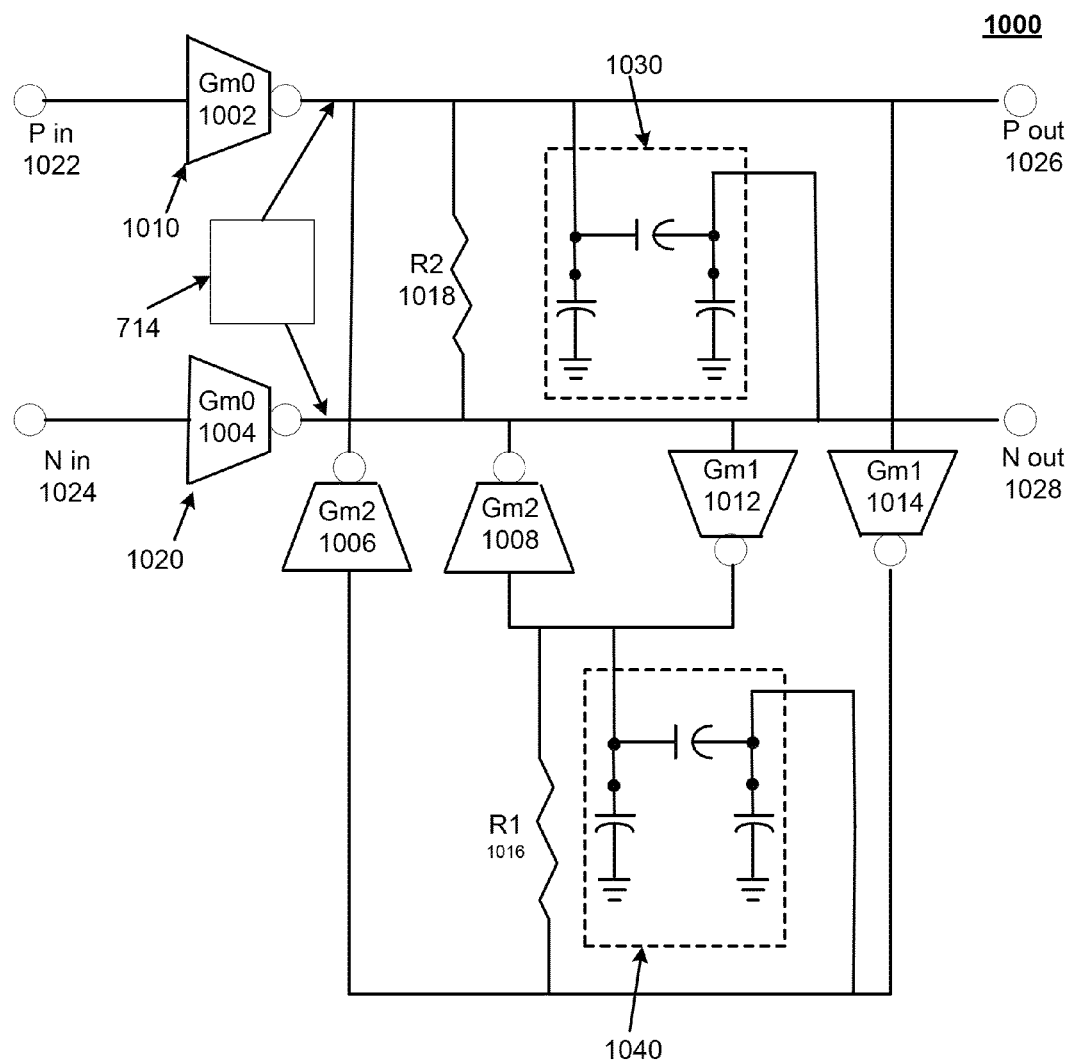
FIG. 10 is a circuit diagram of a differential filter circuit using the circuit and structure(s) of FIGS. 7 and 8.

FIG. 10 is a circuit diagram of a differential filter circuit 1000 using the circuit and structure(s) of FIGS. 7 and 8, for example. FIG. 10 also may be referred to as a filter bi-quad, which uses one or more on-chip capacitor structures with adjustable capacitances; or optionally a low-frequency, band-pass filter. FIG. 10 includes circuit components Gm0 1002, Gm0 1004, Gm1 1006, Gm1 1008, Gm2 1012, and Gm2 1014, resistive elements R1 1016 and R2 1018, and variable capacitors 1030 and 1040, which may be, for example, two instances of the equivalent circuit 700 of FIG. 7 or the equivalent circuit 800 of FIG. 8. The components are connected between a P input 1022 and an N input 1024, and a P output 1026 and an N output 1028.

In operation, a varying characteristics 1010 and 1020 occur at the Gm0 components 1002 and 1004. In one example, the frequency of the input changes or to calibrate the chip the frequency of the Gm0 components 1002 and 1004 needs to be obtained and compensated for, in order, for instance, to maintain the state defined by Equation 1. Varying characteristics also may occur with respect to the Gm1 and Gm2 components 1006-1012. In response, variable capacitors 1030 and 1040 may have their effective capacitance changed, for example to maintain the relationship illustrated with respect to Equation 1. The previously-described control element 714 may be used to that end, for example, to employ a 4 bit or other signal, as described with respect to Table 1, to provide a desired range of variation in effective capacitance that is needed to compensate for any variable characteristic with respect to the circuit components Gm0, Gm1, and Gm2 1002-1012.

While certain features of the described implementations have been illustrated as described herein, many modifications, substitutions, changes and equivalents will now occur to those skilled in the art. It is, therefore, to be understood that the appended claims are intended to cover all such modifications and changes as fall within the true spirit of the embodiments of the invention.

What is claimed is:

1. An apparatus comprising:
a first parallel plate capacitor formed on a semiconductor substrate and connected to a first differential node;
a second parallel plate capacitor formed on the semiconductor substrate and connected to a second differential node; and
a first interdigitated capacitor connected between the first differential node and the second differential node and formed at least partially above the first parallel plate capacitor.

2. The apparatus of claim 1, wherein:
the first differential node is coupled to a power supply; and
the second differential node is coupled to the power supply.

3. The apparatus of claim 1, wherein:
the first differential node is coupled to ground; and
the second differential node is coupled to ground.

4. The apparatus of claim 1, wherein:
the first differential node is coupled to a supply voltage; and
the second differential node is coupled to the supply voltage.

5. The apparatus of claim 1, wherein the first parallel plate capacitor and the second parallel plate capacitor are coupled to a power supply voltage.

6. The apparatus of claim 1, wherein the first parallel plate capacitor and the second parallel plate capacitor are coupled to ground.

7. The apparatus of claim 1, wherein the first and second parallel plate capacitors have equal capacitance.

8. The apparatus of claim 1, wherein the first and second parallel plate capacitors are formed within a well of the semiconductor substrate.

9. The apparatus of claim 1, wherein the first and second parallel plate capacitors are formed within an N-type well of the semiconductor substrate.

10. The apparatus of claim 1, wherein:
the apparatus comprises a metal frame;
a first plate of the first parallel plate capacitor is connected to the metal frame; and
a first plate of the second parallel plate capacitor is connected to the metal frame.

11. The apparatus of claim 1, further comprising a second interdigitated capacitor connected between the first differential node and the second differential node and formed at least partially above the second parallel plate capacitor.

12. The apparatus of claim 11, wherein:
the first and second parallel plate capacitors have equal capacitance; and
the first and second interdigitated capacitors have equal capacitance.

13. The apparatus of claim 11, further comprising a third interdigitated capacitor connected between the first differential node and the second differential node and formed at least partially above at least one of the first parallel plate capacitor and the second parallel plate capacitor.

14. The apparatus of claim 1, further comprising:
a switch associated with a circuit component and at least one of the first parallel plate capacitor, the second parallel plate capacitor, and the first interdigitated capacitor; and
a control element configured to cause a variation in an effective capacitance of the apparatus by opening and closing the switch in response to temperature variation of the circuit component.

15. A method comprising:
forming, on a substrate, a first parallel plate capacitor connected to a first differential node;
forming, on the substrate, a second parallel plate capacitor connected to a second differential node; and
forming, on the substrate, a first interdigitated capacitor connected between the first differential node and the second differential node and formed at least partially above the first parallel plate capacitor.

16. The method of claim 15, wherein the substrate comprises a semiconductor substrate.

17. The method of claim 15, wherein:
the forming the first parallel plate capacitor comprises forming the first parallel plate capacitor within a well of the substrate; and
the forming the second parallel plate capacitor comprises forming the second parallel plate capacitor within the well of the substrate.

18. The method of claim 15, wherein:
the forming the first parallel plate capacitor comprises forming the first parallel plate capacitor within an N-type well of the substrate; and
the forming the second parallel plate capacitor comprises forming the second parallel plate capacitor within the N-type well of the substrate.

19. The method of claim 15, further comprising:
connecting a first plate of the first parallel plate capacitor to a metal frame; and
connecting a first plate of the second parallel plate capacitor to the metal frame.

20. The method of claim 15, further comprising forming, on the substrate, a second interdigated capacitor connected between the first differential node and the second differential node and formed at least partially above the second parallel plate capacitor.

21. The method of claim 15, further comprising:
coupling a switch with at least one of the first parallel plate capacitor, the second parallel plate capacitor, and the first interdigitated capacitor; and
coupling a control element with the switch, the control element being configured to cause a variation in an effective capacitance of at least one of the first parallel plate capacitor, the second parallel plate capacitor, and the first interdigitated capacitor by opening and closing the switch in response to temperature variation associated with the control element.

22. An integrated circuit comprising:
a first parallel plate capacitor formed on a semiconductor substrate and connected to a first differential node;
a second parallel plate capacitor formed on the semiconductor substrate and connected to a second differential node; and
a first interdigitated capacitor connected between the first differential node and the second differential node and formed at least partially above the first parallel plate capacitor.

23. The integrated circuit of claim 22, further comprising a second interdigitated capacitor connected between the first differential node and the second differential node and formed at least partially above the second parallel plate capacitor.

* * * * *